United States Patent [19]

Wegmeth et al.

[11] Patent Number: 5,372,090
[45] Date of Patent: Dec. 13, 1994

[54] MULTIPART SUPPORT CRUCIBLE AND METHOD FOR PRODUCING THE SAME

[75] Inventors: Julius Wegmeth, Wachtberg; Bernd Schmidt, Bonn, both of Germany

[73] Assignee: Ringsdorff-Werke GmbH, Bonn, Germany

[21] Appl. No.: 60,729

[22] Filed: May 12, 1993

[30] Foreign Application Priority Data

Sep. 12, 1991 [DE] Germany .............................. 4130253

[51] Int. Cl.$^5$ .............................................. C30B 15/10
[52] U.S. Cl. .................................... 117/213; 117/13; 117/208; 117/900
[58] Field of Search .............................. 422/246, 249; 156/617.1, DIG. 83; 117/213, 900, 208, 13

[56] References Cited

FOREIGN PATENT DOCUMENTS

| | | | |
|---|---|---|---|
| 3743952 | 7/1988 | Germany . | |
| 4007053 | 9/1990 | Germany . | |
| 54-9172 | 1/1979 | Japan | 156/DIG. 83 |
| 170892 | 10/1982 | Japan . | |
| 58-95693 | 7/1983 | Japan . | |
| 64-72985 | 3/1989 | Japan | 422/249 |
| 64-79093 | 3/1989 | Japan | 422/249 |
| 0154319 | 11/1989 | Japan | 422/249 |
| 03174390 | 7/1991 | Japan | 422/249 |
| 3228892 | 10/1991 | Japan . | |

OTHER PUBLICATIONS

Chemische Technologie, Winnacker-Küchler, vol. 3, 4th edition Anorganische Technologie II 1983 month unknown.

Ullmann's Encyclopedia of Industrial Chemistry Fifth, Completely Revised Edition, vol. A8 1987, no month.

*Primary Examiner*—Robert Kunemund
*Attorney, Agent, or Firm*—Herbert L. Lerner; Laurence A. Greenberg

[57] ABSTRACT

A support crucible includes a central axis, outer radii including longest outer radii defining planes with the central axis, a side wall region having a circumferential direction and a bottom. At least two neighboring segments are separated by joints extending substantially vertically in the side wall region to the bottom and penetrating the bottom. The joints define opposed surfaces of the neighboring segments which always overlap each other in the circumferential direction of the side wall region in an operating state. Each of the surfaces is intersected by a respective one of the planes, at least in the side wall region. According to another embodiment, the joints defining opposed surfaces of the neighboring segments have complementary shapes, the surfaces are formed by cuts beginning at a jacket surface of the side wall region and extending parallel to the central axis and at an angle to the planes, and the cuts extend in a curve to the central axis. A method for producing such a support crucible includes producing the crucible segments by beginning cuts at starting points on the jacket surface to be cut apart into the segments, and directing each of the cuts parallel to the central axis at an angle to one of the planes at one of the starting points and in a curve beginning at one of the starting points and extending to the central axis.

15 Claims, 4 Drawing Sheets

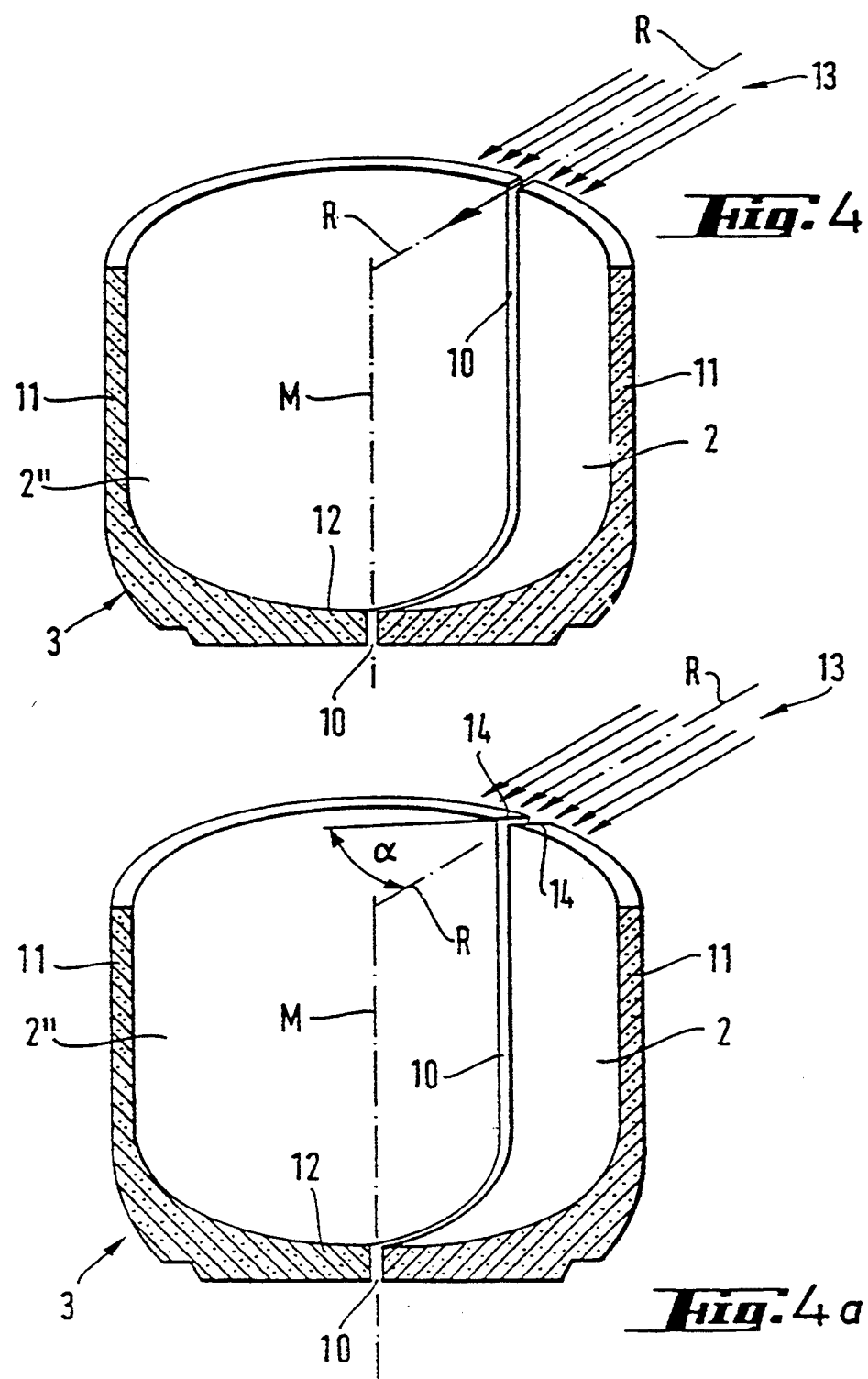

MULTIPART SUPPORT CRUCIBLE AND METHOD FOR PRODUCING THE SAME

CROSS-REFERENCE TO RELATED APPLICATION

This application is a Continuation of International Application Ser. No. PCT/EP92/01956, filed Aug. 26, 1992.

SPECIFICATION

The invention relates to a support crucible and a method for producing the same, including at least two segments, in which the segments are separated by joints extending substantially vertically from the region of the side walls of the crucible to the crucible bottom and also penetrating the crucible bottom.

Such crucibles serve to receive and support one-piece crucibles that are operated at temperatures above their limit of deformation and contain melts of substances. The support crucibles must be capable of compensating for expansion and shrinkage of the supported crucible and therefore include at least two segments made by splitting them vertically. They must additionally perform the function of a susceptor, for transmitting thermal energy to the supported crucible. In terms of their material, stringent demands are placed upon them, so that they must be dimensionally stable at temperatures above the melting or reaction temperature prevailing in the system, and must not form any melts with the material of the particular crucible they support. Ideally, they should neither react chemically with the material of the supported crucible nor give off any contaminants that impede the course of the process.

The primary applicability of support crucibles is in the production of crystals from a melt for the semiconductor industry by the crucible pulling process, particularly from monocrystals of germanium, silicon or binary compounds, for instance. The invention will be described below in conjunction with the process used most frequently, namely the Czochralski process, by way of example. No attempt will be made to describe that process or other crucible pulling processes in detail herein, since relevant literature may be referred to, such as Chemische Technologie [Chemical Technology] by Winhacker and Küchler, 4th Ed., Vol. 3, pp. 424–427 and 452–460, published by Carl Hanser Verlag, Munich and Vienna 1983, as well as Encyclopedia of Industrial Chemistry by Ullmann, 5th Ed., Vol. A8, p. 121 ff., published by VCH Verlagsgesellschaft Weinheim 1987, and the literature cited therein. However, the use of the crucibles according to the invention is not limited to the aforementioned processes. It applies to any process in which crucibles that are heated indirectly from outside, particularly by radiant heating, are enveloped by a support crucible.

In a variant of the crucible pulling process, the melt of an element such as silicon is located in a first crucible that is disposed in the interior of the apparatus. A monocrystalline rod is pulled from the melt by means of a typically rod-shaped monocrystal, as an inoculating or mother crystal, that is dipped into the melt and rotated. The first crucible is frequently made of quartz, and particularly when silicon monocrystals are pulled, the temperature is so high that the quartz crucible becomes plastic and requires some external dimensionally stable support. Graphite crucibles are preferably used as the supports. They must be made in multiple parts because the quartz crucible contracts or expands upon temperature changes, and the support crucible must go along with those motions. Particularly upon cooling, expansion of the quartz crucible, which would be critical, occurs.

The inner crucible configuration is brought to the desired melting temperature by heating devices and is kept at that temperature. Preferably, radiant heating is used for that purpose. A configuration of one or more heating elements surrounding the crucibles at a distance from them is heated, either by direct passage of electric current or inductively, and transmits heat substantially by radiation to the support crucible, which also acts as a susceptor through which the heat is transmitted substantially by conduction to the supported crucible and to the melt.

Problems arise in such a case in pulling crystals and the most stringent possible demands are made in terms of purity and freedom from defects in the crystalline structure. Some of the radiation passes through the joints separating the segments of the support crucible to strike the crucible containing the melt directly, and at those directly irradiated zones, as compared with the zones of the crucible that are heated indirectly by the susceptor segments and therefore uniformly, it causes temperature irregularities and therefore misdirected flows and eddies in the melt, resulting in discontinuities in crystal growth and an undesired takeup of contaminants such as oxygen. Another problem arises if, as is most frequently the case in industry, the supported crucible is made of quartz glass and the support crucible is made of carbon, especially graphite. At the zones where the edges of the separating joints of the segments touch the quartz crucible, reactions that are reinforced by the direct effect of heat radiation to the quartz crucible take place between the carbon of the support crucible and the quartz, forming carbon monoxide and silicon monoxide. Those events weaken the quartz crucible and the support crucible along the separating joints, which shortens their useful life and considerably increases the expense of the process. German Patent DE 40 07 053 C describes a graphite support crucible for pulling silicon monocrystals from quartz crucibles, which is equipped on its inner surface, upper edge and contacting surfaces of the segments with a protective layer of oriented carbon filaments disposed in a connecting scaffold of carbon. In one possible embodiment, the protective layer may additionally contain carbon or graphite powder as a filler. The purpose of that invention was to create a support crucible for quartz crucibles that is resistant to the attack of silicon, silicon monoxide, and silicon dioxide. Although the version described therein does lessen the general problem of the reaction of materials touching one another and the reaction of products created by that reaction with the graphite crucible, nevertheless it does not address the specialized problems that arise from the direct exposure of the quartz crucible wall to heat along the separating joints of the support crucible segments, and consequently cannot solve those problems, either.

SUMMARY OF INVENTION

It is accordingly an object of the invention to provide a multipart support crucible and a method for producing the same, which overcome the hereinafore-mentioned disadvantages of the heretofore-known devices and methods of this general type and which provide a support crucible made up of segments for a supported crucible containing a melt, with the support crucible being formed in such a way that the supported crucible is no longer exposed to the radiation originating in the heater surrounding the support crucible, in the region of the separating joints located between the segments of the support crucible in the jacket region.

With the foregoing and other objects in view there is provided, in accordance with the invention, a support crucible, comprising a central axis, outer radii including longest outer radii defining planes with the central axis; a side wall region having a circumferential direction; a bottom; at least two neighboring segments being separated by joints extending substantially vertically in the side wall region to the bottom and penetrating the bottom; the joints defining opposed surfaces of the neighboring segments always overlapping each other in the circumferential direction of the side wall region in an operating state; and each of the surfaces being intersected by a respective one of the planes, at least in the side wall region.

In accordance with another feature of the invention, the joints defining opposed surfaces of the neighboring segments having complementary shapes and always overlapping in the circumferential direction in an operating state; and the surfaces being formed by cuts beginning at the jacket surface and extending parallel to the central axis and at an angle to the planes, the cuts extending in a curve to the central axis.

In accordance with a further feature of the invention, the opposed surfaces of the neighboring segments have complementary shapes.

With the objects of the invention in view, there is also provided a method for producing a support crucible having a central axis, outer radii including longest outer radii defining planes with the central axis, a side wall region with a jacket surface, a bottom, and at least two segments being separated by joints extending substantially vertically through the side wall region to the bottom and penetrating the bottom, which comprises producing the crucible segments by beginning cuts at starting points on the jacket surface to be cut apart into the segments, and directing each of the cuts parallel to the central axis at an angle to one of the planes at one of the starting points and in a curve beginning at one of the starting points and extending to the central axis.

Through the use of the overlapping configuration of the boundary surfaces of the segments that oppose one another in the circumferential direction of the support crucible, the heat radiation originating in the heating surrounding the crucible configuration in the entire jacket region no longer strikes the wall of the crucible that contains the melt. Therefore, the harmful effects of heat entering the regions of the separating joints located between the support crucible segments are thus averted.

Crucible segments that can be used to assemble support crucibles according to the invention can be produced by suitable ceramic molding and production processes that are known per se, with subsequent machining of preforms or chip-producing machining from solid material, if necessary.

In a second method for producing support crucibles according to the invention, entire crucibles are first made, and then are severed vertically into at least two segments by cutting or other chip-producing machining steps, as follows: At the places where the crucible jacket is to be separated, cuts on the jacket surface that extend parallel to the center axis of the crucible but at an angle other than 90° from the jacket surface are begun and extended in a curve, penetrating the crucible bottom as well, as far as the center axis. At the separating joints penetrating the crucible wall, the support crucible segments created by means of these cuts have overlapping complementary surfaces that protect the supported crucible against the incident radiation. The degree of overlap is determined by the angle, relative to the surface of the crucible jacket, at which the cut is made. It is defined from one case to another to suit given conditions. This kind of method does not produce overlapping boundary surfaces between the crucible segments at the joints at the crucible bottom. However, this is no disadvantage, since these joints can be covered by the retaining and reinforcement part that is disposed on the bottom of the support crucible and retains the support crucible segments in their positions. Where it is not possible or only partly possible to provide such a covering, then the negative effect of heat radiation to the supported crucible is only slight, because of the oblique angle of incidence of the attendant low degree of absorption of the radiation, which originates in the heating elements disposed substantially parallel to the crucible wall. Through the use of such a method, every separating joint can advantageously be produced with high precision in one machining step using a simple cutting tool, such as a bandsaw.

In accordance with an added feature of the invention, the support crucible may include two, three or more segments. However, the preferred embodiment includes three identically constructed segments. Such a crucible can be produced efficiently, is easy to manipulate and compensates adequately well for the expansion and shrinkage of the supported crucible.

In accordance with an additional feature of the invention, the support crucibles are formed of carbon. Due to its good machinability, its capability of absorbing heat rays, its good thermal conductivity and its chemical inactivity, the use of electrographite is recommended in most cases. Other materials made of carbon that may be considered are carbon-fiber-reinforced carbon (CFC) and glass carbon.

In order to produce highly pure crystals, the materials from which the reaction chambers of the apparatuses used are made must also be correspondingly clean. Therefore, in accordance with yet a concomitant feature of the invention, the carbon parts intended for the production of support crucibles are cleaned by means of a cleaning treatment carried out at high temperatures using halogen-containing gases. The most widely used method for this is cleaning of the graphite with gases during the graphiting treatment.

No attempt will be made to describe the methods for producing the aforementioned carbon materials, since they are state of the art and well known to anyone skilled in the art and can also be learned from the relevant literature.

The invention has the following advantages:
1. Reduction of the wear to support crucibles.
2. Reduction of the wear to supported melting crucibles.
3. Reduction of the danger of contamination of the melt from which crystals are to be pulled.
4. Making the temperature of the melting crucible wall uniform.
5. Efficient production of support crucibles that are improved by increased precision of structure, with the aid of the curved cutting.

Advantages numbered 3 and 4 above have a directly positive effect on the quality of the crystal rods being produced. Advantages 1 and 2 lower the expense of crystal pulling, and advantage 5 permits high-precision production of the improved versions of support crucibles.

Other features which are considered as characteristic for the invention are set forth in the appended claims.

Although the invention is illustrated and described herein as embodied in a multipart support crucible and a method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF DRAWINGS

FIGS. 4 and 4a are vertical-sectional views illustrating the heart of the invention by means of a comparative illustration of a path of heat radiation rays in a conventional crucible and a crucible according to the invention.

DETAILED DESCRIPTION

Figure 1:
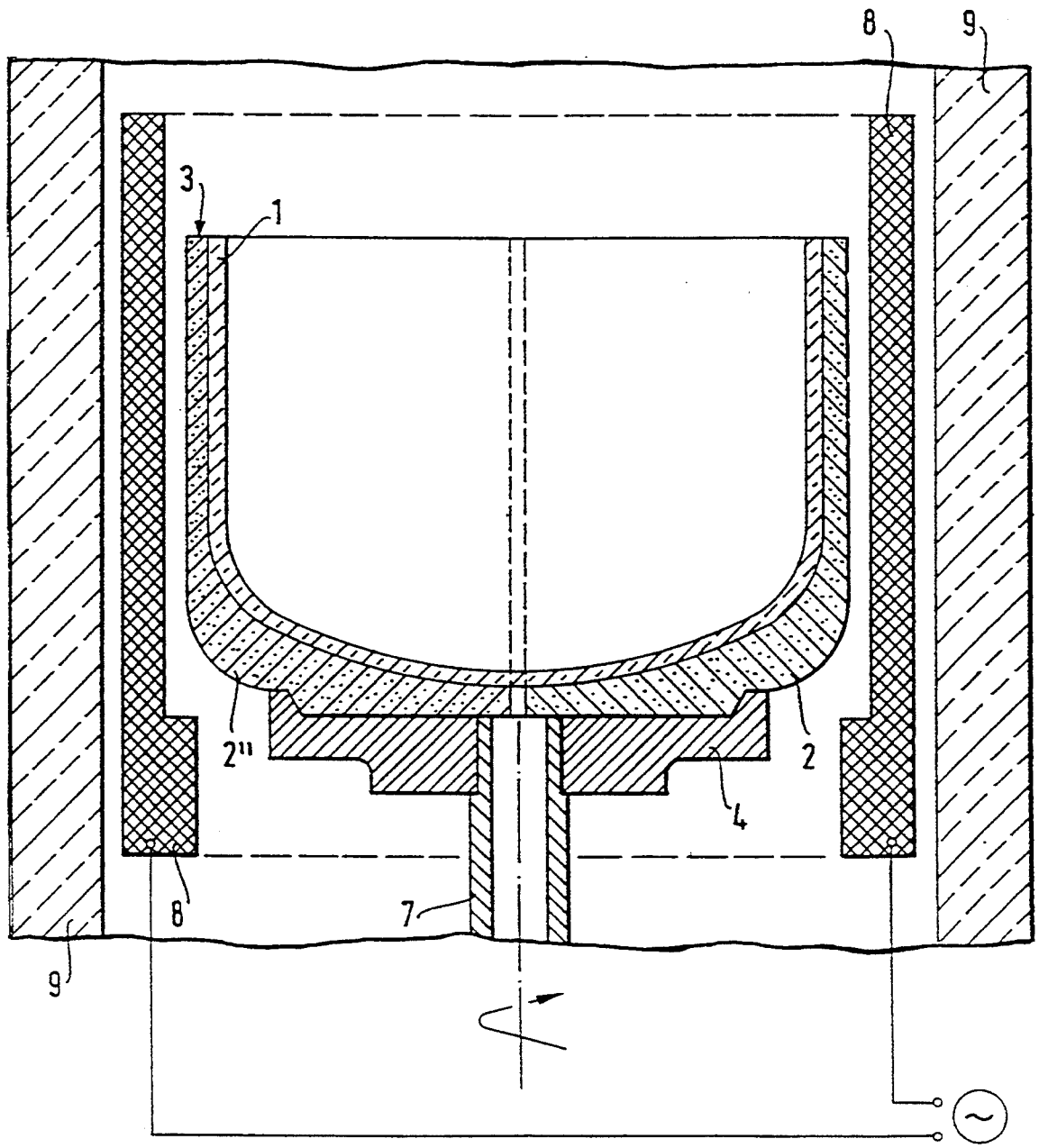
FIG. 1 is a fragmentary, diagrammatic, vertical-sectional view of elements of a crystal pulling system that are important for the invention.

Referring now to the figures of the drawing in detail and first, particularly, to FIG. 1 thereof, there is seen a quartz glass melting crucible 1, containing a non-illustrated silicon melt. The quartz crucible 1 is enveloped by a graphite support crucible 3, which, as better seen in FIGS. 2a and 3a, includes three segments 2, 2' and 2'', only 2 and 2 of which can be seen in the sectional view. The segments 2, 2', 2'' are fixed in their position by a retaining part 4 of graphite, that engages the bottom profile of the support crucible 3 in such a way that they are capable of compensating for the motions of the supported quartz crucible that occur during the course of the method. The configuration including the quartz crucible 1, the support crucible 3 and the retaining part 4 rests on a shaft 7, by way of which the aforementioned crucible configuration can be kept in rotation in the direction of the arrow during the crystal pulling.

In order to generate and maintain the necessary melting heat, the crucibles 1, 3 are surrounded by a radiant heater 8, for example a graphite heating element having a random course. The heat rays originating at this heating element 8 are absorbed by the support crucible 3, and the heat from it is passed uniformly on to the quartz crucible 1 and its contents. All of the system parts described thus far and some that are not shown, such as a rotatable crystal pulling rod that dips into the silicon melt, protective gas guide devices, coverings, or material feeding devices, are located in a closed container, only part of which is shown. The container has a highly insulating wall 9 made up of multiple shells.

Figure 2:
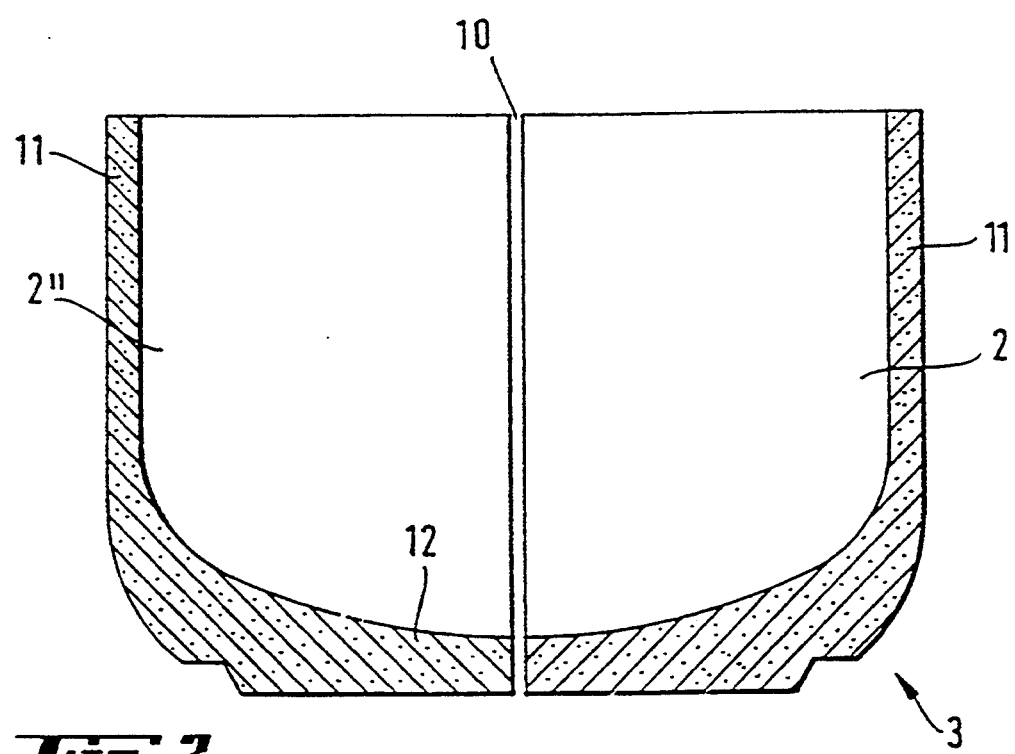
FIGS. 2 and 2a are respective vertical-sectional and plan views showing a support crucible of a conventional type.
Figure 2A:
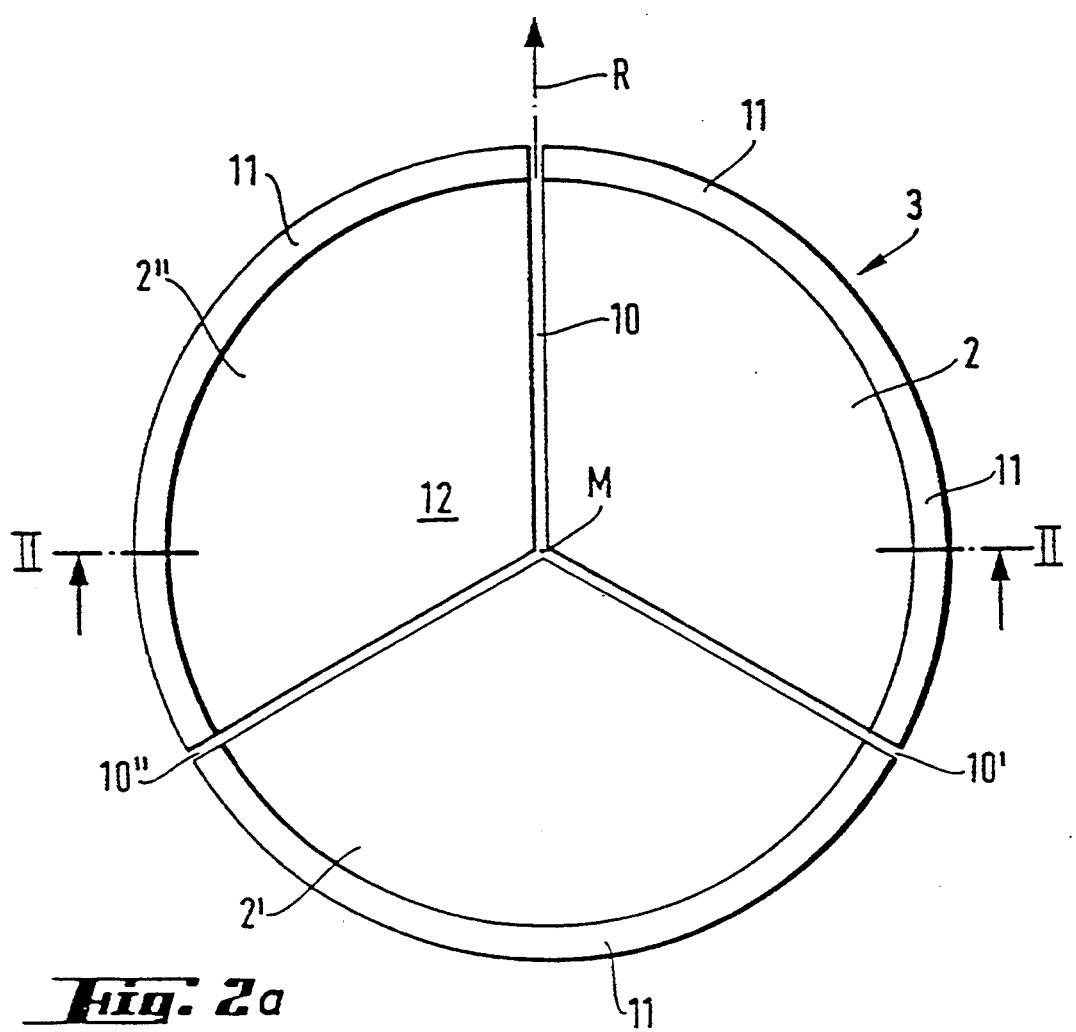

FIGS. 2 and 2a show the support crucible 3, including the three segments 2, 2', 2'', in accordance with the prior art. Rays of heat can pass through joints 10, 10', 10'' in a crucible wall 11, because the joints are located in the direction of a radial R. A crucible bottom 12 is also shown.

Figure 3:
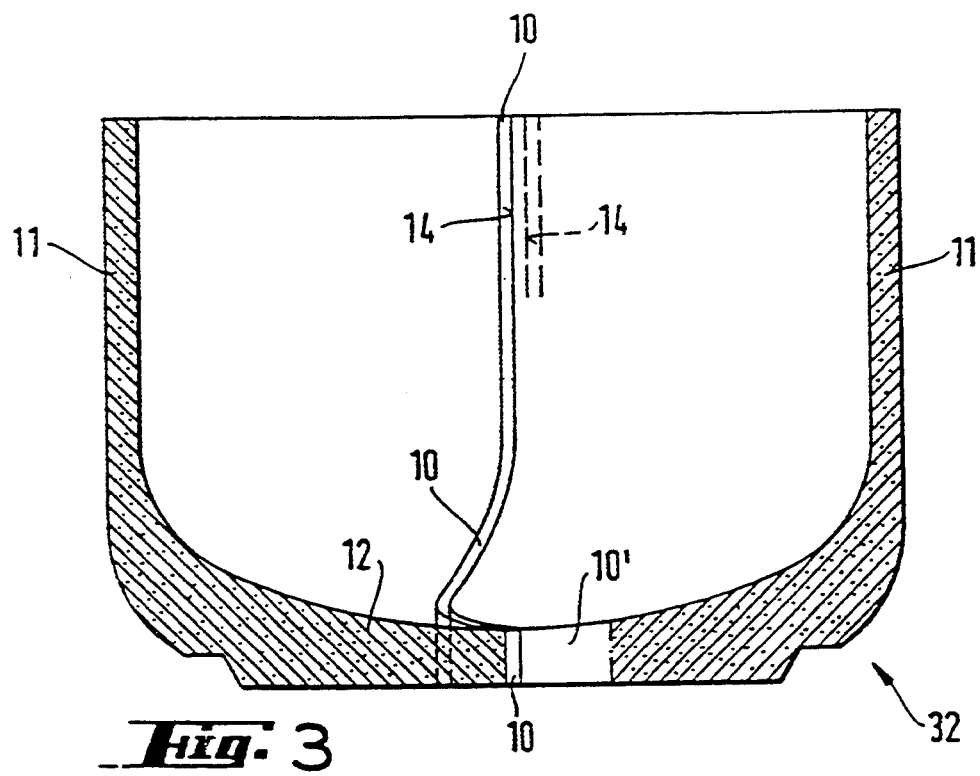
FIGS. 3 and 3a are respective vertical-sectional and plan views showing a support crucible according to the invention, with joints extending in a curve from a crucible jacket to a crucible center.
Figure 3A:
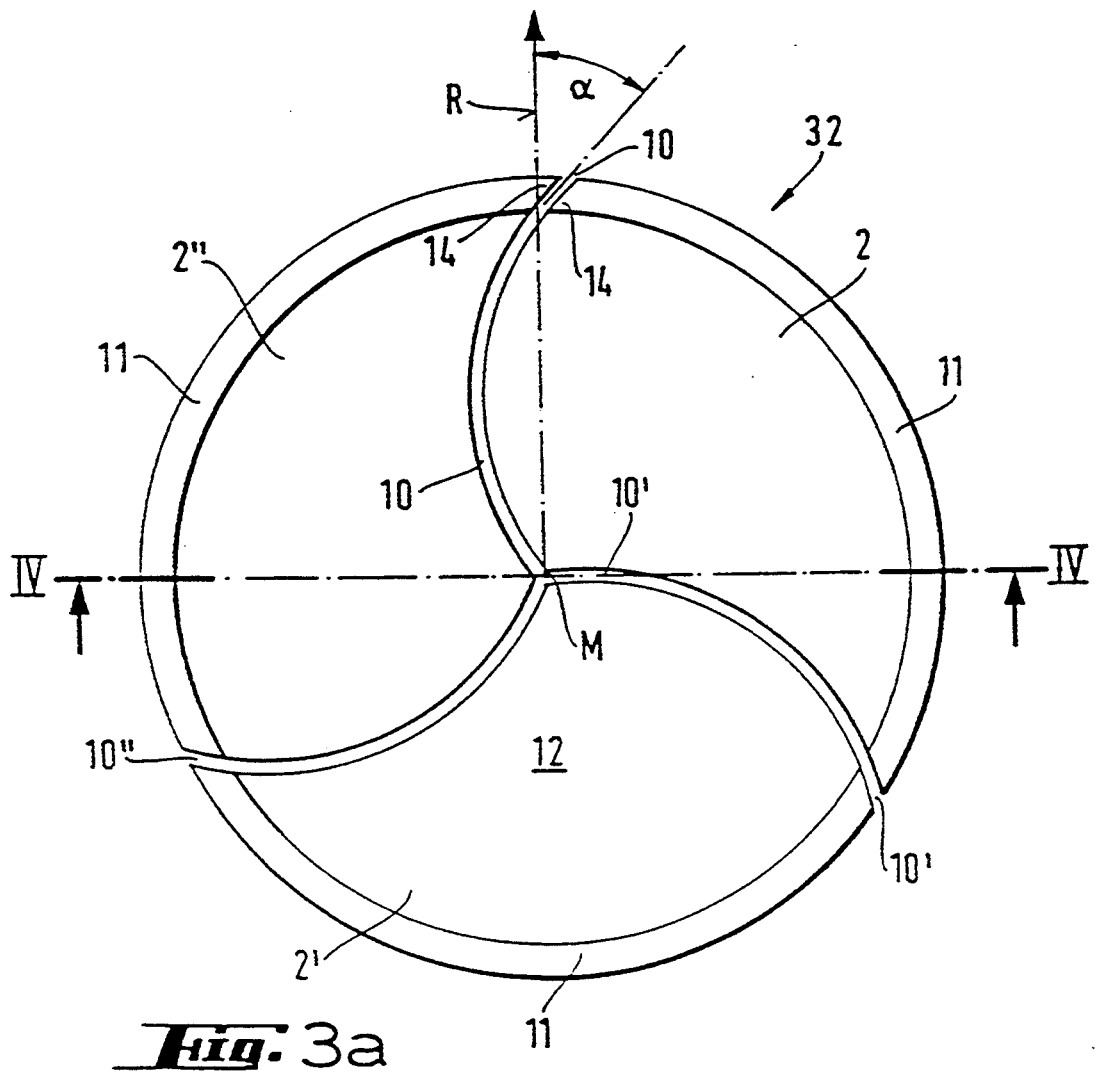

An embodiment according to the invention having a support crucible 32 including the three segments 2, 2', 2'' is shown in FIGS. 3 and 3a. The vertically disposed joints 10, 10', 10'', which are provided with a curvature, in this case penetrate the crucible wall 11 at an angle alpha which is inclined with respect to the radial R. They are defined by a cut that begins at the crucible wall 11 and is guided in a curve to a central axis M of the crucible. The crucible bottom 12 is vertically penetrated by the joints 10, 10', 10''. The boundary surfaces of adjacent ones of the segments 2, 2' and 2'' form overlapping zones 14.

In one embodiment of the invention, neighboring segments 2, 2', 2'' are separated by the joints 10, 10', 10'' which define opposed surfaces of the segments 2, 2', 2'' that always overlap each other in the circumferential direction of the side wall region 11 in an operating state. Each of the surfaces are intersected by a respective plane defined by the longest outer radii and the central axis M, at least in the side wall region 11.

In another embodiment of the invention, the joints 10, 10', 10'' defining opposed surfaces of the neighboring segments 2, 2', 2'' have complementary shapes and always overlap in the circumferential direction in an operating state. The surfaces are formed by cuts beginning at the jacket surface and extending parallel to the central axis M and at an angle to the planes defined by the longest outer radii and the central axis M, with the cuts extending in a curve to the central axis M.

The method of the invention includes producing the crucible segments 2, 2', 2'' by beginning cuts at starting points on the jacket surface to be cut apart into the segments 2, 2', 2'', and directing each of the cuts parallel to the central axis M at an angle to one of the planes at one of the starting points and in a curve beginning at one of the starting points and extending to the central axis M.

FIGS. 4 and 4a show the effect of the invention. In FIG. 4, heat rays 13 radially striking the crucible wall 11 pass through the joints 10 that separate the segments 2, 2'. They can strike the non-illustrated quartz crucible. In FIG. 4a, the heat rays are hindered from passing through the joints 10 by an overlapping zone 14 of the segments 2. A non-illustrated quartz crucible located inside the support crucible can not be reached by the heat rays that arrive from the non-illustrated heating element and strike the crucible wall vertically.

We claim:

1. A support crucible, comprising:
   a central axis, outer radii including longest outer radii defining planes with the central axis;
   a side wall region having a circumferential direction;
   a bottom;
   at least two neighboring segments being separated by joints extending substantially vertically in said side wall region to said bottom and penetrating said bottom;
   said joints defining opposed surfaces of said neighboring segments always overlapping each other in the circumferential direction of said side wall region in an operating state; and each of said surfaces being intersected by a respective one of the planes, at least in said side wall region.

2. A support crucible, comprising:

a central axis, outer radii including longest outer radii defining planes with the central axis;

a side wall region having a circumferential direction and a jacket surface;

a bottom;

at least two neighboring segments being separated by joints extending substantially vertically in said side wall region to said bottom and penetrating said bottom;

said joints defining opposed surfaces of said neighboring segments having complementary shapes and always overlapping in the circumferential direction in an operating state; and said surfaces being formed by cuts beginning at the jacket surface and extending parallel to the central axis and at an angle to the planes, the cuts extending in a curve to the central axis.

3. The support crucible according to claim 1, wherein said opposed surfaces of said neighboring segments have complementary shapes.

4. The support crucible according to claim 1, wherein said at least two neighboring segments are three identically constructed segments.

5. The support crucible according to claim 2, wherein said at least two neighboring segments are three identically constructed segments.

6. The support crucible according to claim 1, wherein said side wall region and said bottom are formed of electrographite.

7. The support crucible according to claim 2, wherein said side wall region and said bottom are formed of electrographite.

8. The support crucible according to claim 1, wherein said side wall region and said bottom are formed of carbon fiber reinforced carbon.

9. The support crucible according to claim 2, wherein said side wall region and said bottom are formed of carbon fiber reinforced carbon.

10. The support crucible according to claim 1, wherein said side wall region and said bottom are formed of glasslike carbon.

11. The support crucible according to claim 2, wherein said side wall region and said bottom are formed of glasslike carbon.

12. The support crucible according to claim 1, wherein said side wall region and said bottom are formed of a gas-cleaned carbon material.

13. The support crucible according to claim 2, wherein said side wall region and said bottom are formed of a gas-cleaned carbon material.

14. In a method for producing a support crucible having a central axis, outer radii including longest outer radii defining planes with the central axis, a side wall region with a jacket surface, a bottom, and at least two segments being separated by joints extending substantially vertically through the side wall region to the bottom and penetrating the bottom, the improvement which comprises:

producing the crucible segments by beginning cuts at starting points on the jacket surface to be cut apart into the segments, and directing each of the cuts parallel to the central axis at an angle to one of the planes at one of the starting points and in a curve beginning at one of the starting points and extending to the central axis.

15. The method according to claim 14, which comprises producing crystals in the crucible with a pulling method.

* * * * *